United States Patent [19]

Krukonis et al.

[11] Patent Number: 5,360,478

[45] Date of Patent: Nov. 1, 1994

[54] GAS ANTI-SOLVENT RECRYSTALLIZATION PROCESS

[75] Inventors: Val J. Krukonis, Lexington; P. M. Gallagher, Lowell; M. P. Coffey, Leominster, all of Mass.

[73] Assignee: Phasex Corporation, Lawrence, Mass.

[21] Appl. No.: 723,245

[22] Filed: Jun. 28, 1991

Related U.S. Application Data

[63] Continuation-in-part of Ser. No. 421,978, Oct. 16, 1989, abandoned.

[51] Int. Cl.$^5$ ............................................. C30B 7/00
[52] U.S. Cl. ............................... 117/68; 117/925; 23/295 R; 564/107; 564/108
[58] Field of Search ............... 156/621, DIG. 113; 23/295 R; 564/107, 108; 117/68

[56] References Cited

U.S. PATENT DOCUMENTS

| 1,801,509 | 4/1931 | Jackman | 564/107 |
| 2,347,660 | 5/1944 | Burtle | 564/107 |
| 2,395,856 | 3/1946 | Foster et al. | 564/108 |
| 3,943,235 | 3/1976 | Costain | 423/410 |

FOREIGN PATENT DOCUMENTS

| 288122 | 10/1988 | European Pat. Off. | 564/107 |
| WO9003782 | 4/1990 | WIPO . | |

OTHER PUBLICATIONS

Connick et al., "Dislocation Etching of Cyclotrimethylene Trinitramine Crystals" Journal of Crystal Growth, vol. 5 (1969) pp. 65-69.
Halfpenny et al. "Dislocation in Energetic Materials" Journal of Crystal Growth vol. 69 (1984) pp. 73 to 81.
Gallagher et al. "Gas Antisolvent Recrystallization: New Process to Recrystallize Compounds . . . " ACS Symp. Ser. 406 1989 abstract only.

*Primary Examiner*—Robert Kunemund
*Attorney, Agent, or Firm*—Kane, Dalsimer, Sullivan, Kurucz, Levy, Eisele and Richard

[57] ABSTRACT

Disclosed is a method for recrystallizing solid materials (e.g. RDX) from systems comprised of a solute, which is the eventual material recrystallized, a liquid which is a suitable solvent for the solute, and a gaseous component which is soluble within the solvent and whose presence therein causes the solvent to approach or attain a supersaturated state, thereby precipitating (recrystallizing) the solute material. By control of process parameters (pressure, temperature, time, and rate, rate of injection of gas, etc.) the operator can influence the properties of the material recrystallized.

8 Claims, 16 Drawing Sheets

EXPANSION OF NMP WITH CARBON DIOXIDE

EXPANSION OF CYCLOHEXANONE WITH CARBON DIOXIDE

EXPANSION OF NMP WITH CHLORODIFLUOROMETHANE

VARIATION OF SUPERSATURATION WITH RATE OF ADDITION OF ANTI-SOLVENT

EXPANSION PATHS FOR ANTI-SOLVENT ADDITION

100μ

200μ

200μ

200μ

GAS ANTI-SOLVENT RECRYSTALLIZATION PROCESS

This is a continuation-in-part of copending application Ser. No. 07/421,978 filed on Oct. 16, 1989 now abandoned.

BACKGROUND OF THE INVENTION

Many solid materials are industrially recrystallized from solution using anti-solvent methods. Recrystallization is practiced for the purpose of purifying a material or for changing its particle size, or both. Generally describing current industrial recrystallization processes, a material to be recrystallized is dissolved in a liquid solvent, and a liquid anti-solvent, i.e., a non-solvent for the material, is added to the solvent. The solvent and anti-solvent are miscible liquids. At some concentration of anti-solvent in the solvent, the mixed liquid is no longer a solvent for the solid material, and precipitation of the solid occurs. Parameters such as the choice of solvent and anti-solvent, the initial concentration of solid in solution, the rate of admixing of the two liquids, and the direction of admixing, i.e., whether the anti-solvent is added to the solution or whether the solution is added to the anti-solvent, and other factors, combine to determine the particle size, particle size distribution, morphology, and other characteristics of the recrystallized material. Other parameters in the recrystallization process can include different temperatures for the two liquids so that thermal, as well as anti-solvent, considerations come into play in causing the solid to precipitate from solution.

The liquid solvent-liquid anti-solvent recrystallization process suffers to a lesser or greater degree in any particular application from several limitations. For example, it is sometimes difficult to attain extremely rapid and intimate admixing, and, thus, the concentration of solid is not uniformly changed throughout the liquid resulting in a wide particle size distribution. Additionally, liquid is frequently occluded in the recrystallized material or causes bubbles. During the drying process, the occluded material diffuses or vaporizes causing intragranular cavities which can affect the performance of the material in its use. On occasion, no matter what combination of parameters is used and no matter how well the effects of the parameters are understood, the desired particle characteristics are not achieved. For example, the explosive cyclotrimethylenetrinitramine (referred to as RDX in the explosives community) is recrystallized by liquid solvent—anti-solvent systems into 100 to 200$\mu$ particles that virtually always contain intragranular cavities as large as 50$\mu$. A photomicrograph of this material is shown as FIG. 1.

As a practical matter, industrial applications require that the two liquids must be separated and reused. The only industrially viable separation process is distillation, and distillation of large volumes of liquid solutions. This is more so when the two components have similar boiling points, is energy intensive and thus, expensive. The ever-increasing cost of energy makes this a further reality.

There are other industrial processes for producing particles of a desired size. For example, simple mechanical comminution can be used to produce small particles in processes such as grinding or fluid energy milling using gases; the latter process employs impinging jets of air or nitrogen loaded with particles of material, collisions between particles resulting in their being comminuted. Fluid energy milling and grinding are difficult to apply to the problem of comminuting sensitive explosives because of the potential for explosions to occur. Pump grinding, i.e., recirculation of a slurry of particles through a pump, can more safely comminute sensitive materials, but the particles formed are usually very irregular. In the case of certain explosives, irregular, sharp-edged crystals confer extreme and undesired sensitivity to the material. For completeness, there are other industrial processes for forming crystals that are not recrystallization processes per se. For example, some materials are made by admixing solutions of two soluble species that, when the components contact, react or complex to form an insoluble and desired product or intermediate. This product can be used as is or it may subsequently dissolved in some other solvent and recrystallized by a liquid anti-solvent; the overall process of chemical reaction and recrystallization, of course, may suffer from the limitations described earlier if a liquid anti-solvent is used.

DISCLOSURE OF THE INVENTION

We have found that a supercritical fluid (a gas or liquid at conditions of pressure and temperature above its critical point) or a gas at conditions near its vapor pressure can dissolve in and expand an organic liquid, and if the gas is not a solvent for the solid material that is dissolved in the liquid, i.e., the solid is substantially insoluble in the gas, the solid will recrystallize when some sufficiently high level of expansion is reached. In other words, the gas will act like an anti-solvent. As will be developed subsequently, gas anti-solvents exhibit some advantageous characteristics not possessed by analogous liquid anti-solvents.

FIG. 2 shows the expansion behavior of an organic solvent, N-methyl pyrrolidone (a solvent for nitroguanidine), and carbon dioxide at 25° C. FIG. 3 shows the expansion behavior of cyclohexanone (a solvent for RDX) and carbon dioxide at three temperature levels below the critical temperature of carbon dioxide (which is 31° C.) and two above the critical temperature. FIG. 4 shows the expansion behavior of chlorodifluoromethane, with N-methyl pyrrolidone and another gas, chlorodifluormethane at 25° C. Similar expansion behavior is exhibited by literally hundreds of organic liquids, e.g., acetone, alcohol, hydrocarbons, etc., with many supercritical fluids and gases near their respective vapor pressures (hereinafter "supercritical fluids an gases near their respective vapor pressures" shall be referred to as gases); thus, it can be stated that the volumetric expansion behavior shown in FIGS. 2, 3, and 4 is quite general for many selected organic liquid-gas pairs and that the process has broad application to the recrystallization of solid materials so long as the solid to be recrystallized is not soluble in the gas.

Advantages of the process which we refer as (Gas Anti-Solvent Recrystallization, reside in several factors, e.g., mixing between the gas and liquid solution can occur at the molecular level. Thus, local variations in solute concentration are non-existent. The rate of admixing can be varied by orders of magnitude greater than that achievable in liquid anti-solvent processes, thus affording a control of particle size range unachievable in the liquid process. Finally, since the gas can be removed from the liquid solution by simple pressure let down, the energy intensive distillation step that is required for the liquid anti-solvent process is eliminated with the process. Additionally, all the particles and crystals that have been formed by the process are found to be void free as shown subsequently in the examples and is one of an important feature of the process.

The disclosure of the parent application, U.S. Ser. No. 421,978, now abandoned, is incorporated herein by reference.

DETAILED DESCRIPTION OF THE PREFERRED EMBODIMENT

Figure 1:
FIG. 1 is photomicrographs of RDX crystals produced in accordance with the prior art.
Figure 2:
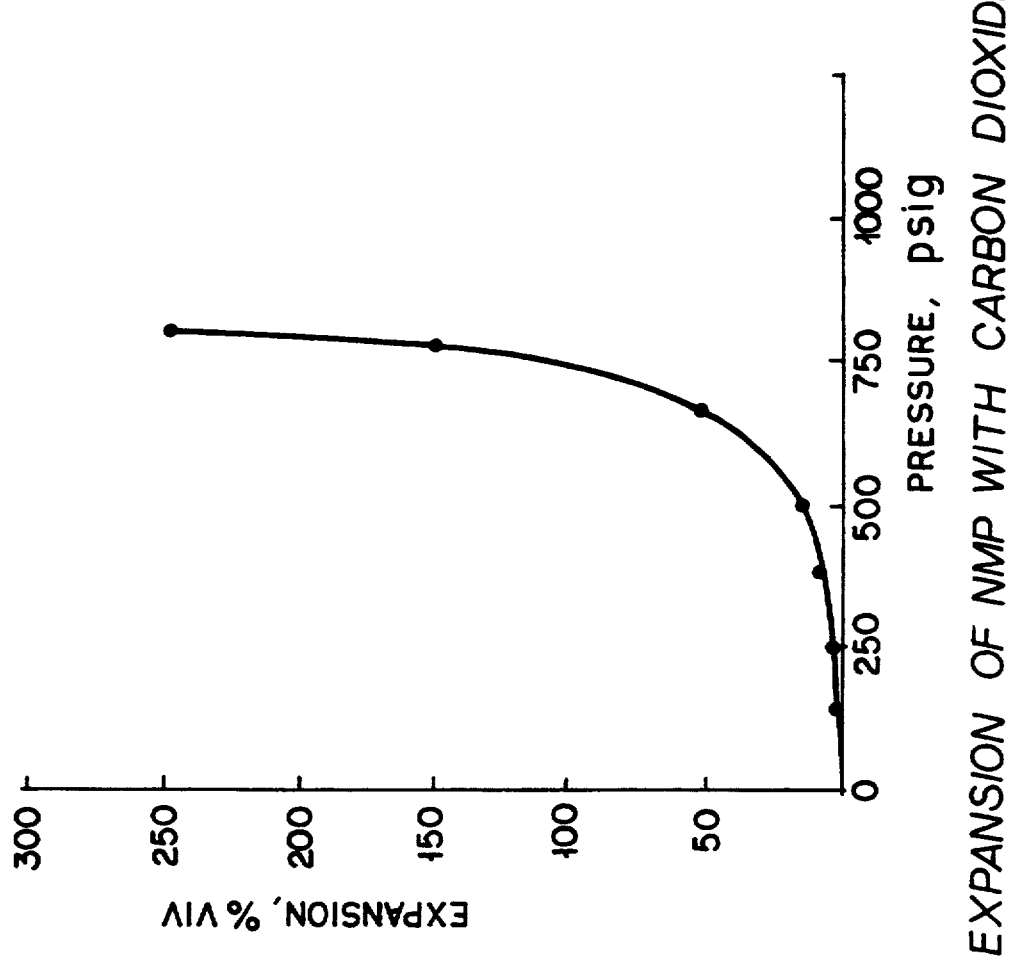
FIG. 2 is a graph showing the expansion behavior for an N-methyl pyrrolidone/carbon dioxide system.
Figure 3:
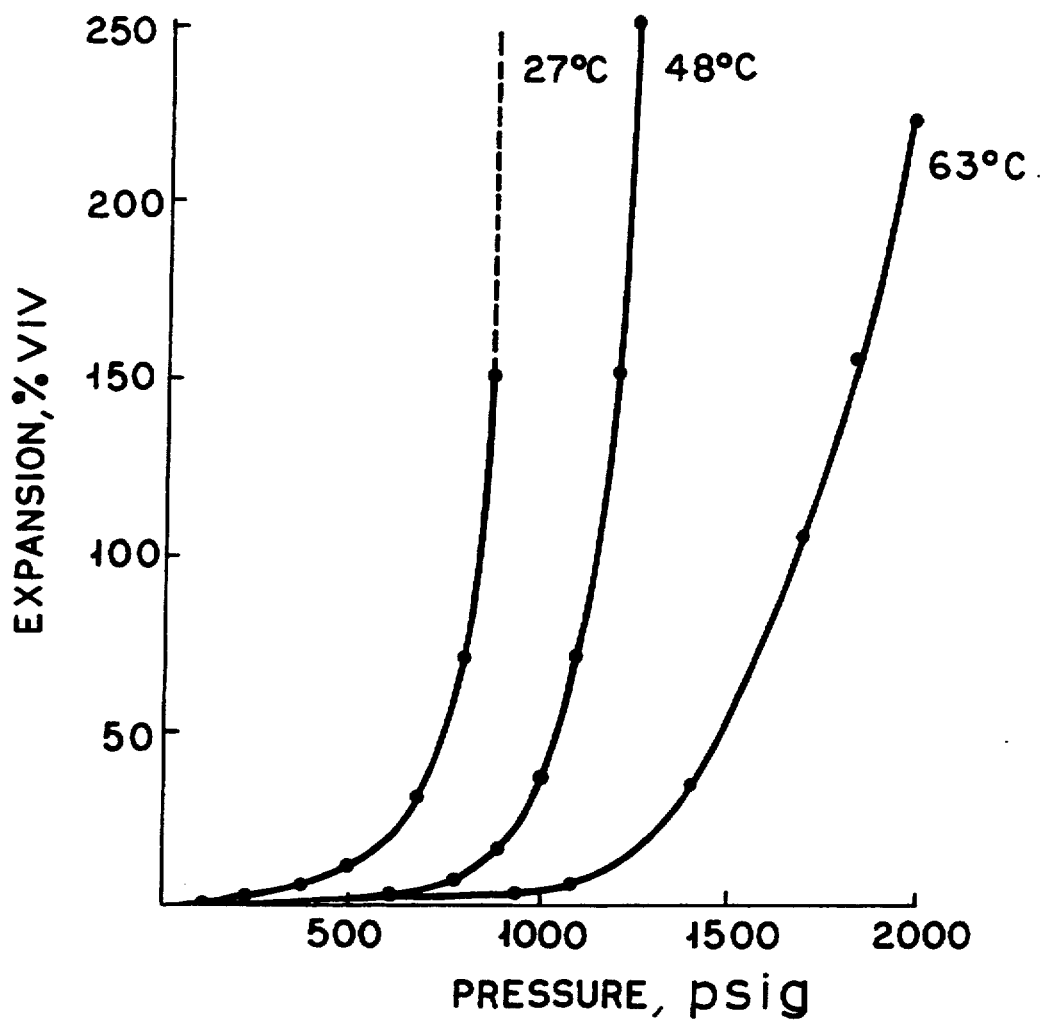
FIG. 3 is a graph showing the expansion behavior for cyclohexanone (a solvent for RDX) and carbon dioxide system at three different temperatures.
Figure 4:
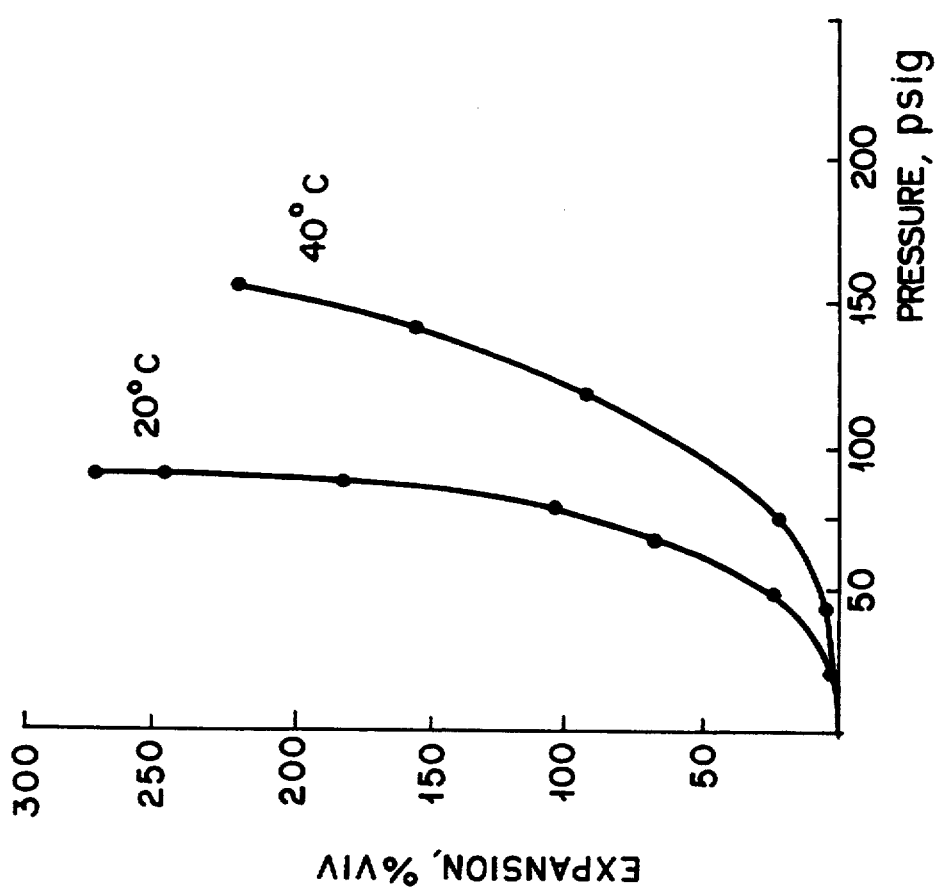
FIG. 4 is a graph showing the expansion behavior of a chlorodifluoromethane/carbon dioxide system.

All the particles of materials that are subsequently shown in photomicrographs in the examples were produced according to the process, which applies principles of nucleation that were enunciated many years ago by Professor J. Willard Gibbs (The Collected Works of J. W. Gibbs, Vol. 1, Thermodynamics, Yale University Press, New Haven, 1957.) and rate equations developed by Becker and Doering (as described by A. W. Adamson, Physical Chemistry of Surfaces, Interscience Publishers, Division of John Wiley, New York, 1960). The equations, although strictly applicable to the case of condensing vapors, may be modified to explain how a quite different nucleation process that employs a gas as an anti-solvent can be operated to form particles of controlled size and size distribution.

The equilibrium in an assembly of dissolved molecules which can combine to form a critical nucleus beyond which size favorable fluctuations will cause the nuclei to grow has been described in the literature by Gibbs. (The term "critical" here does not relate to the critical point of a gas or liquid. The term has been used by many authors to describe the specific nucleus size that can subsequently grow to form particles. Later, the term "critical supersaturation ratio" will be referred to, this term also has no relation to the critical point of a gas or liquid.) Gibbs presented the conditions of critical nuclei formation based upon free energy considerations. The formation of an embryo, i.e., an assembly of molecules of a size smaller than the critical nucleus, requires that an interface between two phases form. Thus, the free energy of the system will have to increase initially until an embryo reaches some critical diameter described by Gibbs there are two competing modes of lowering the particle free energy; the nucleus can grow indefinitely, or it can shrink and disappear. Critical nuclei will grow at the expense of subcritical embryos so that the final particle size will be dependent upon some initial critical nuclei concentration. Equations describing the rate of nucleation have been derived by others using the teachings of Gibbs. Using Gibbs free energy consideration that describe the critical nucleus, the derived equation for the rate of formation of nuclei of this critical size is:

$$\text{rate} = Z \exp(\Delta G_{max}/RT) \text{tm} \quad (1)$$

where
- Z is the collision frequency, calculable from classical kinetic theory and
- $\Delta G_{max}$ is the Gibbs free energy expression which derives from nucleus surface energy considerations and is given below.
- R is the gas constant in units consistent with G and the temperature, T.

The free energy relation is:

$$\Delta G_{max} = B/[RT \ln S]^2 \quad (2)$$

where
- B is a constant derivable from physical properties of the system,
- S is the supersaturation ratio. (For purposes of illustration, in a vapor-liquid system S is the ratio of actual component pressure to the normal vapor pressure; in a system involving a solute dissolved in a solvent, S is the ratio of actual concentration to saturation concentration).

From Equations 1 and 2 it is seen that the nucleation rate is very strongly influenced by the supersaturation ratio. As an example of the rapid increase in the nucleation rate as supersaturation is increased, it can be shown for the condensation of water vapor that the number of nuclei formed (per second per cc for water vapor at 0° C.) is only $10^{-8}$ at a supersaturation ratio of 3.5 whereas it is $10^3$ at a ratio of 4.5. The ratio at which the nucleation rate changes from imperceptible (e.g., $10^{-8}$) to very large (e.g., $10^3$) is termed the critical supersaturation ratio. The rate of nucleation at that point is termed catastrophic, and the phenomenon is termed catastrophic nucleation.

As related earlier, Equations 1 and 2 are strictly applicable only to the homogeneous condensation of a vapor to liquid droplets. In a two or three component system such as, for example, anti-solvent recrystallization (either a gas or liquid anti-solvent) or for recrystallization from a melt, other factors such as viscosity of the medium, the mode of nucleation, i.e., whether homogeneous or heterogeneous, etc., come into play, and the equations are modified by theses other factors. Equations 1 and 2 are, nevertheless, of value in predicting some general effects of these other systems.

The final particle size that can be achieved in the particular recrystallization is related to both the rate of formation of critical nuclei described above and by the rate of growth of these nuclei. The overall rate of growth of the nuclei, once they have been formed, and the effect of concentration on growth can be given by the mass transfer relation.

$$\text{growth} = kA\Delta C \qquad (3)$$

where k is a mass transfer coefficient,

A is the surface area of the particle at any particular instant, and $\Delta C$ $\Delta C$ is given by $C-C_{eq}$ in the concentration of the component in the gas minus its equilibrium concentration, and C is the concentration difference driving force for growth at any instant.

Figure 5:
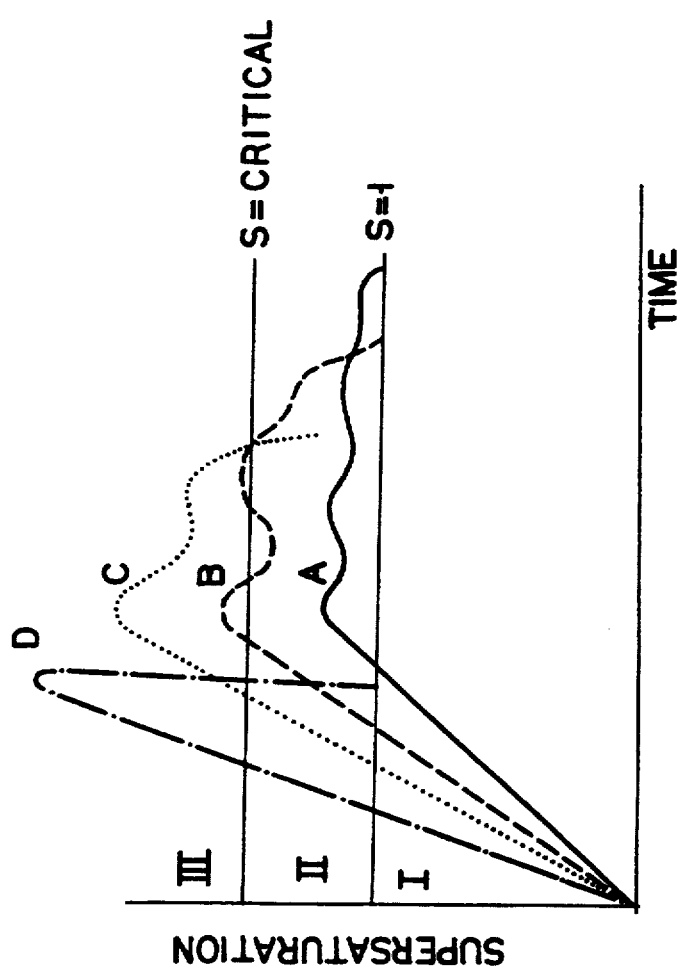
FIG. 5 is a graph showing concentration and time relationships and the effect of concentrations above and below supersaturation.

In an anti-solvent recrystallization process, particle size and particle size distribution are determined by the interaction between the nucleation rate and the growth rate of crystals, on one hand, and by the rate of creation of supersaturation, on the other hand; all three are influenced by the manner of addition of the anti-solvent. FIG. 5 is a qualitative picture of simultaneous events that occur when an anti-solvent is added to a solution of a solute that is to be recrystallized. The three zones shown in FIG. 5 designated I, II, and III, denote three areas of supersaturation. Zone I is for a supersaturation less than 1, i.e., for actual solute concentrations less than saturation. No growth of particles can occur in this zone, and, in fact, if there are any particles somehow present, they will dissolve. In Zone II, the supersaturation is less than the critical value discussed above, but mechanisms of Equation 3. Zone III represents very high supersaturation levels, and in this regime catastrophic nucleation can occur.

The four paths, A, B, C, and D, shown in FIG. 5 represent the events for four different rates of addition of anti-solvent, and they depict the simultaneous creation of supersaturation (by anti-solvent addition) and the consumption of supersaturation (by nucleation and growth). The rate of addition as indicated by Curve A is low, and only very little nucleation occurs when the supersaturation exceeds S=1. The Path A rate of addition is so low that the rate of nucleation and the diffusional growth of those (few) nuclei formed maintain the supersaturation below the critical value until the concentration of solute in solution eventually falls to saturation, S=1. Curve B represents a higher rate of addition, high enough to exceed the critical supersaturation level. The solution is rather more quickly depleted of solute by the higher rate of nucleation and the higher overall growth rate (and several nucleation-supersaturation decreases are denoted by the relative maxima and minima in the curve). The addition via Curve C is a variant of Curve B, viz., a still higher rate of anti-solvent addition. Finally, the rate of addition depicted by Curve D is so high that almost all the solute in solution is consumed by the formation of nuclei, and the solute in solution is depleted almost solely by that mechanism.

Figure 6:
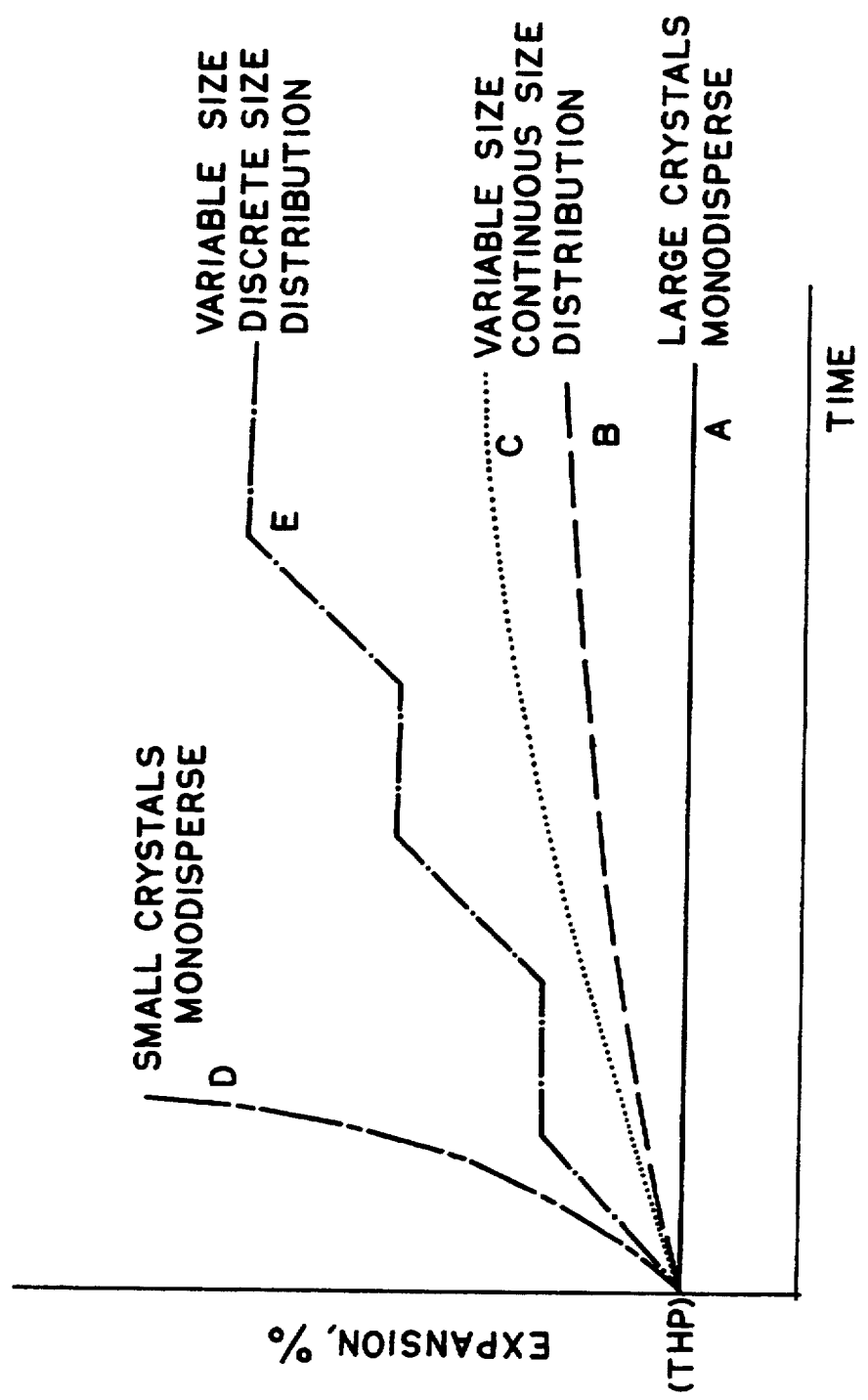
FIG. 6 is a graph showing expansion paths for anti-solvent addition.

These nucleation and growth events are depicted differently on a solution expansion-time plot in FIG. 6. FIG. 6 summarizes the various experimental expansion paths that were used to produce the particles shown in the previous examples. On the ordinate axis the term THP signifies threshold pressure, the pressure level at which nuclei can be detected by the unaided eye (in a vessel such as a high pressure sight glass). Starting at threshold pressure (for strict accuracy, at the amount of expansion at THP), if the subsequent expansion is essentially nil as shown by the Curve A expansion path, relatively few nuclei are formed as related earlier; they can grown to be large because there remains in solution a relatively large amount of solute for growth after these few nuclei are formed. Curves B and C depict faster rates of addition of gas anti-solvent shown as Curves B and C in FIG. 5, both rates of addition are similar in their effects on size and size distribution, i.e., both will result in a wide distribution, the specific final results a function of the particular rate of addition and concentration. Curve D represents an extremely high rate of expansion by extremely high intermixing and essentially monodisperse and very small particles will result. Another path, Curve E, which was not shown in FIG. 5 is included in FIG. 6 for completeness; a discrete particle size distribution is obtained by alternate gas injection and a hold at constant expansion for some period of time, the gas injection-hold time sequence continued until the solution is depleted in recrystallizeable solute.

EXAMPLES

Photomicrographs of various compounds processed by Gas Anti-Solvent Recrystallization are shown below to point out that the process can be applied to a broad range of materials, that the process offers control of particle size over a wide range, that void-free material can be produced, and that the morphology of the particles formed can be varied and controlled when gases are used as anti-solvents. Conditions for each example are given to shown how a slow or a rapid expansion influences particle size, how the liquid solvent can affect the size, and by showing so many compounds, solvents, and gases, how the process is very generally applicable for recrystallizing materials.

All the tests were carried out in a sight glass (a so-called Jerguson gauge) with an internal cavity of 60 ml. A charge of liquid, typically 15–20 ml, was added to the cavity and the vessel sealed. Gas was introduced at various rates of pressure rise and to various final pressure levels, the particles that were formed collected and analyzed by optical microscopy.

Figure 7:
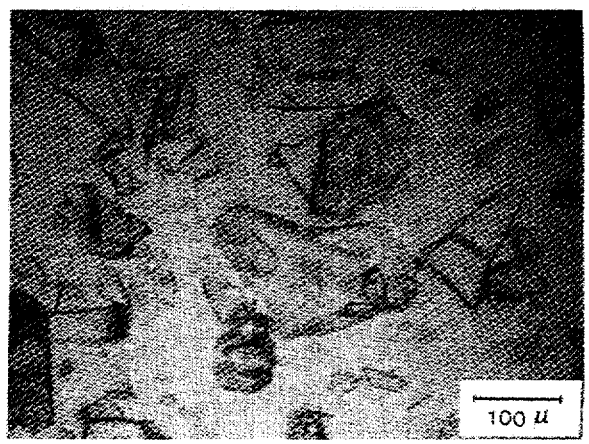
FIG. 7 shows large particle RDX recrystallized from 7% by weight RDX in acetone solution by carbon dioxide.

FIG. 7 shows large particle RDX recrystallized from 7% by weight RDX in acetone solution by carbon dioxide. No voids (seen as dark spots in FIG. 1) are present in the recrystallized RDX in comparison to the RDX that contains voids as seen in FIG. 1. The gas was injected over into the cavity a period of four minutes (a slow injection rate) into a solution held at 25° C. until a final pressure of 900 psi was reached.

Figure 8:
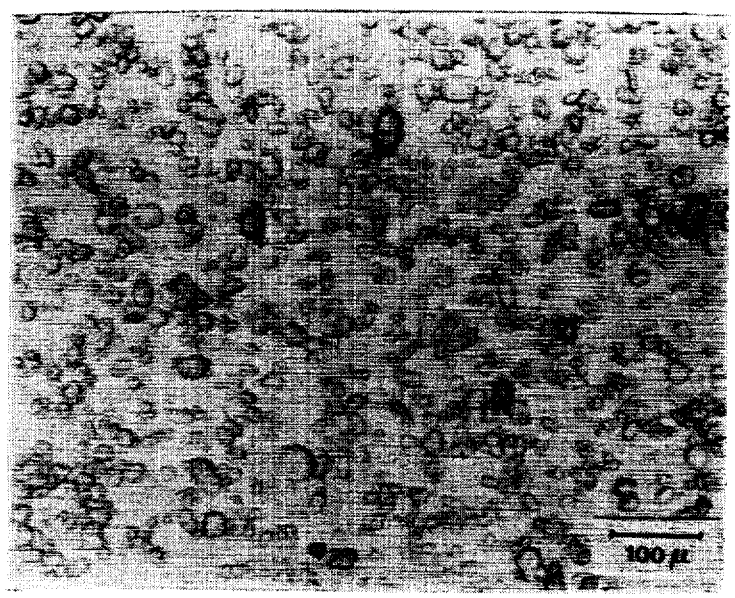
FIG. 8 shows small particle RDX (again void free) recrystallized from 10% RDX in cyclohexanone solution by carbon dioxide.

FIG. 8 shows small particle RDX (again void free) recrystallized from 10% RDX in cyclohexanone solution by carbon dioxide; the injection rate in this instance was very rapid, i.e., carbon dioxide was admitted within a period of two seconds, at a temperature of 25° C. to a final pressure of 900 following essentially Curve A of FIGS. 5 and 6.

Figure 9:
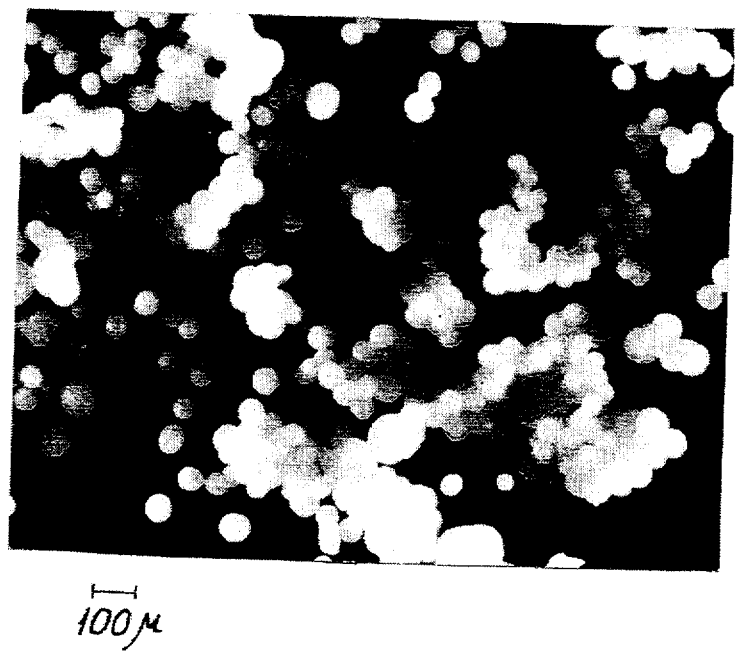
FIG. 9 shows large spherical particles of nitroguanidine (referred to in the explosives community as NQ) recrystallized from 5% NQ in N-methyl pyrrolidone solution by chlorodifluormethane.
Figure 10:
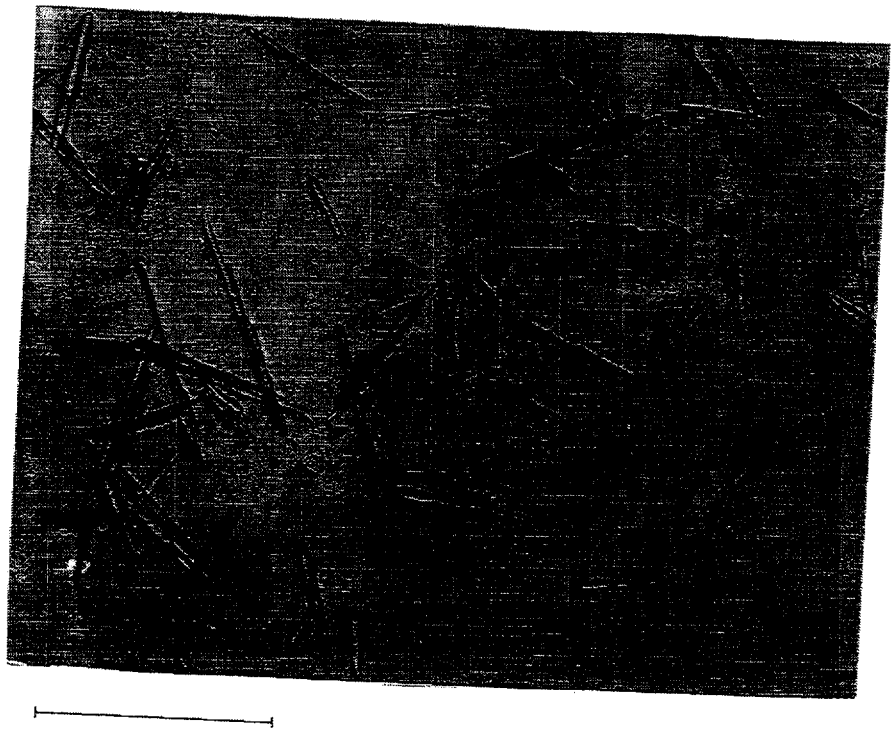
FIG. 10 shows, for comparison, the NQ that is produced in the industrial synthesis process.
Figure 11:
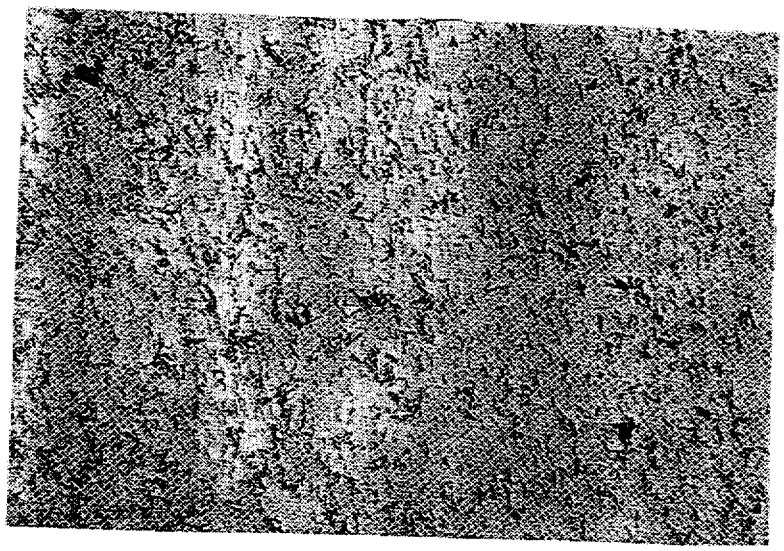
FIG. 11 shows NQ recrystallized from 8% NQ in N,N dimethyl formamide (DMF) solution by dichlorodifluoromethane.

FIG. 9 shows large spherical particles of nitroguanidine (referred to in the explosives community as NQ) recrystallized from 5% NQ in N-methyl pyrrolidone solution by chlorodifluoromethane. The particles were formed from a 5% NQ in NMP solution by injecting chlorodifluoromethane at a very low rate, 20 minutes, according to Curve D of FIGS. 5 and 6 to a final pressure of 110 psi while holding the solution at 25° C. (Additives to modify the nucleation and growth of NQ were present in solution in this specific example, vis., cobalt (II) nitrate at 2000 ppm with respect to the NQ and a surfactant, Ethomeen C/12 at 0.1% concentration.) Large spherical NQ particles of the type shown in FIG. 9 are desired for incorporation into propellants and munitions at high solids loading. For comparison, FIG. 10 shows the NQ that is produced in the industrial synthesis process where a liquid anti-solvent is used; the anti-solvent is admixed with the solution continuously as described above. The material that is produced industrially is in the form a high aspect ratio needles which are not suitable for incorporation into high solids content propellants and explosives. To point out again the capabilities of Gas Anti-Solvent Recrystallization, FIG. 11 shows NQ recrystallized from 8% NQ in N,N dimethyl formamide (DMF) solution by dichlorodifluoromethane; in this case, particles of the order of microns are formed by rapid (within five seconds) and complete expansion of the DMF-NQ solution at 25° C. to a final pressure of 120 psi. Even though the mixing rate with the gas anti-solvent is very fast (as far as the experimental set up in the laboratory is concerned), the rate is much slower than in the production process (at the Sunflower Army Ammunition Plant, De Soto, Kans. where mixing occurs in literally one second), yet the particles in FIG. 11 are much smaller than those in FIG. 10.

Figure 12:
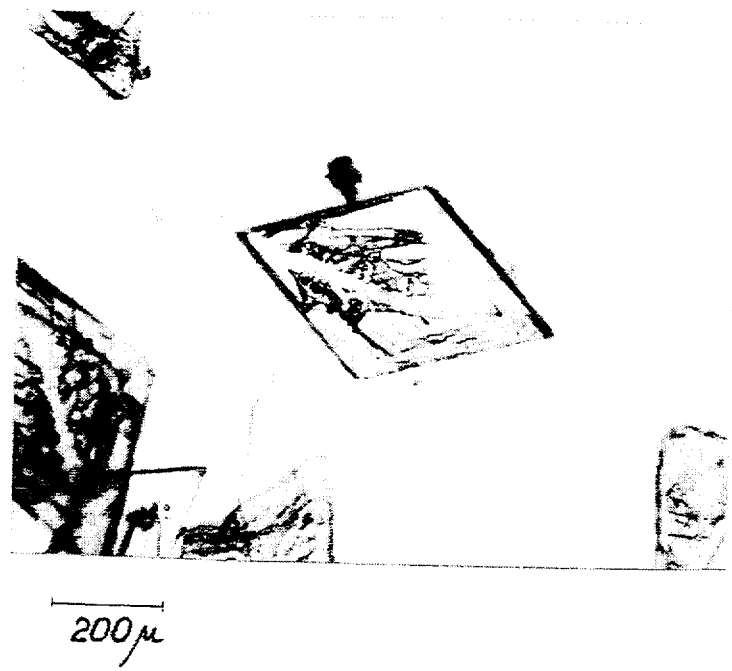
FIG. 12 shows saligenin (a pharmaceutical precursor) recrystallized from a 20% cyclohexanone solution by carbon dioxide.
Figure 13:
FIG. 13 shows the parent material of the particles shown in FIG. 12.

The process exhibits great utility in the recrystallization of difficult to process explosives, but Gas Anti-Solvent Recrystallization is also applicable to many other materials, e.g., to pharmaceuticals, dyes, and other compounds. To illustrate the general applicability of the process for organic compounds, FIG. 12 shows saligenin (a pharmaceutical precursor) recrystallized from a 20% cyclohexanone solution by carbon dioxide by injecting gas over a 10 minute period at 25° C. to a final pressure of 800 psi. The size and shape of the particles shown in FIG. 12 are to be compared to the parent material shown in FIG. 13.

Figure 14:
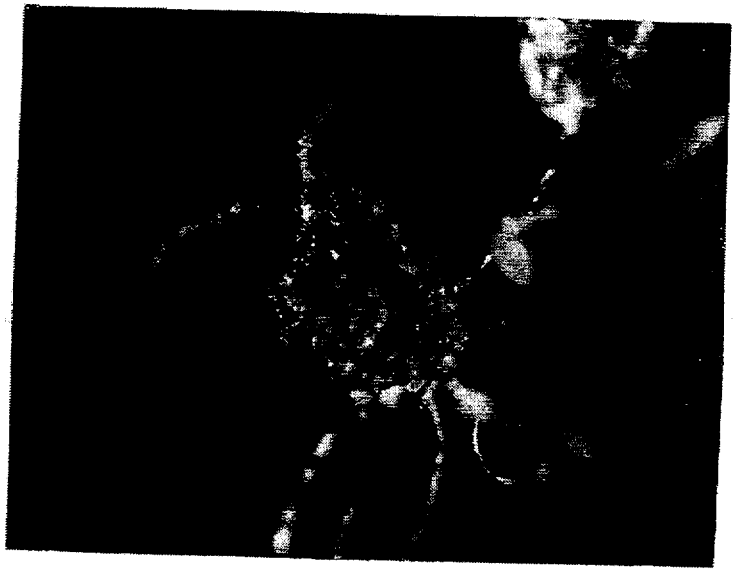
FIG. 14 shows large particle of cobalt chloride recrystallized from 5% acetone solution by carbon dioxide injection at a slow rate at 20° C. increasing pressure over a 30 minute period to 725 psi.
Figure 15:
FIG. 15 shows small particles of cobalt chloride formed by rapid (30 second) injection of carbon dioxide to a pressure of 750 psi.
Figure 16:
FIG. 16 shows the parent material of the particles shown in FIGS. 14 and 15.

Gas Anti-Solvent Recrystallization is also applicable to recrystallization of inorganic compounds, again, providing that only the two conditions be met, viz., that gas anti-solvent be soluble in the solution and that the solute be not soluble in the gas. (The solute must, of course, be soluble in the same liquid as the gas is.) FIG. 14 shows large particle of cobalt chloride recrystallized from 5% acetone solution by carbon dioxide injection at a slow rate at 20° C. increasing pressure over a 30 minute period to 725 psi. FIG. 15 shows small particles of cobalt chloride formed by rapid (30 second) injection of carbon dioxide to a pressure of 750 psi. The particles shown in FIGS. 14 and 15 are to be compared with the parent cobalt chloride shown in FIG. 16.

The discussion of nucleation and growth principles and the examples above show Gas Anti-Solvent Recrystallization is generally applicable to the recrystallization of materials. The process provides control of particle size over a wide range, and as all the examples show, intragranular cavities are eliminated.

We claim:

1. A process for recrystallizing essentially void-free crystals of cyclotrimethylenetrinitramine comprised of the steps of:
    a) adding a gaseous component to a liquid which acts as a solvent for and contains the cyclotrimethylenetrinitramine, said gaseous component being soluble within the solvent, the cyclotrimethylenetrinitramine being insoluble within said gaseous component;
    b) said gaseous component being added in an amount suitable for causing the solvent to approach, attain or exceed a supersaturated state;
    c) precipitating the cyclotrimethylenetrinitramine from the solvent resulting in recrystallized cyclotrimethylenetrinitramine that is essentially void free.

2. The process according to claim 1 wherein the gaseous component comprises carbon dioxide.

3. The process according to claim 1 wherein solvent is selected from the group consisting of acetone and cyclohexanone.

4. The process according to claim 2 wherein solvent is selected from the group consisting of acetone and cyclohexanone.

5. A process for recrystallizing essentially void free crystals of cobalt chloride comprised of the steps of:
    a) adding a gaseous component to a liquid which acts as a solvent for and contains the cobalt chloride said gaseous component being soluble within the solvent, the cobalt chloride being insoluble within said gaseous component;
    b) said gaseous component being added in an amount suitable for causing the solvent to approach, attain or exceed a supersaturated state;
    c) precipitating the cobalt chloride from the solvent resulting in recrystallized nitroguanidine that is essentially void free.

6. The process according to claim 5 wherein the gaseous component is comprised of carbon dioxide.

7. The process according to claim 5 wherein the solvent is comprised of acetone.

8. The process according to claim 6 wherein the solvent is comprised of acetone.

* * * * *